(12) United States Patent
Yoshinaga et al.

(10) Patent No.: US 8,759,688 B2
(45) Date of Patent: Jun. 24, 2014

(54) ELECTRONIC COMPONENT MOUNTING STRUCTURE

(75) Inventors: Seiichi Yoshinaga, Saga (JP); Yoshiyuki Wada, Fukuoka (JP); Tadahiko Sakai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 1014 days.

(21) Appl. No.: 12/159,837

(22) PCT Filed: Sep. 21, 2007

(86) PCT No.: PCT/JP2007/069123
§ 371 (c)(1),
(2), (4) Date: Jul. 1, 2008

(87) PCT Pub. No.: WO2008/035819
PCT Pub. Date: Mar. 27, 2008

(65) Prior Publication Data
US 2010/0000773 A1 Jan. 7, 2010

(30) Foreign Application Priority Data
Sep. 22, 2006 (JP) .................................. 2006-256667

(51) Int. Cl.
*H05K 1/16* (2006.01)

(52) U.S. Cl.
USPC ............. 174/260; 428/94; 428/417; 438/126; 438/108; 257/678; 257/686; 257/723; 257/737; 257/787

(58) Field of Classification Search
USPC ............. 174/260; 428/94, 417; 438/126, 108; 257/678, 686, 723, 737, 787
See application file for complete search history.

(56) References Cited

U.S. PATENT DOCUMENTS

| | | | | | |
|---|---|---|---|---|---|
| 3,894,686 | A | * | 7/1975 | Weinberg et al. | 238/8 |
| 3,895,149 | A | * | 7/1975 | Sheffler et al. | 428/94 |
| 3,936,575 | A | * | 2/1976 | Watanabe et al. | 428/417 |
| 4,477,607 | A | * | 10/1984 | Litke | 523/212 |
| 4,719,119 | A | * | 1/1988 | Thompson et al. | 427/1 |

(Continued)

FOREIGN PATENT DOCUMENTS

| | | |
|---|---|---|
| JP | 11-307686 A | 11/1999 |
| JP | 2000-299356 | 10/2000 |

(Continued)

OTHER PUBLICATIONS

International Search Report for PCT/JP2007/069123, Feb. 23, 2008.

*Primary Examiner* — Xiaoliang Chen
(74) *Attorney, Agent, or Firm* — Pearne & Gordon LLP

(57) ABSTRACT

The invention intends to provide an electronic component mounting structure where the repairability and the impact resistance are combined. In an electronic component mounting structure, a plurality of solder balls disposed in plane between an electronic component and a substrate is melted to bond the electronic component and the substrate and a resin of which tensile elongation after the curing is in the range of 5 to 40% is filled in portions that are gaps between the electronic component and the substrate and correspond to at least four corners of the electronic component to reinforce. Since the reinforcement area is small, the repairability such as the easy removability of the resin and the reusability of the substrate are excellent, the resin itself is allowed to expand to the impact at the drop to play a role of reinforcing the bonding without breaking, and the impact resistance is excellent as well.

5 Claims, 2 Drawing Sheets

(56) References Cited

U.S. PATENT DOCUMENTS

| | | | | |
|---|---|---|---|---|
| 4,789,399 | A | * | 12/1988 | Williams et al. ............... 524/388 |
| 5,356,717 | A | * | 10/1994 | Choki et al. ................ 428/425.9 |
| 6,012,848 | A | * | 1/2000 | Michioka et al. ................ 384/43 |
| 6,049,122 | A | * | 4/2000 | Yoneda ........................ 257/668 |
| 6,071,596 | A | * | 6/2000 | Kawai et al. ............... 428/32.87 |
| 6,121,689 | A | * | 9/2000 | Capote et al. ................. 257/783 |
| 6,335,571 | B1 | * | 1/2002 | Capote et al. ................. 257/787 |
| 6,498,054 | B1 | * | 12/2002 | Chiu et al. .................... 438/108 |
| 6,616,984 | B1 | * | 9/2003 | Capote et al. ................. 427/510 |
| 6,870,248 | B1 | * | 3/2005 | Shibata ........................ 257/686 |
| 6,998,011 | B2 | * | 2/2006 | Schoenfeld et al. ....... 156/331.4 |
| 2002/0022687 | A1 | * | 2/2002 | Hikita et al. .................. 524/528 |
| 2002/0031868 | A1 | * | 3/2002 | Capote et al. ................. 438/126 |
| 2002/0061451 | A1 | * | 5/2002 | Kita et al. ......................... 430/2 |
| 2002/0093104 | A1 | * | 7/2002 | Goldmann et al. ........... 257/774 |
| 2003/0001942 | A1 | * | 1/2003 | Odamura et al. ............. 347/213 |
| 2003/0089978 | A1 | * | 5/2003 | Miyamoto et al. ........... 257/723 |
| 2003/0116835 | A1 | * | 6/2003 | Miyamoto et al. ............ 257/678 |
| 2003/0192643 | A1 | * | 10/2003 | Schoenfeld et al. .......... 156/330 |
| 2004/0223044 | A1 | * | 11/2004 | Oshima et al. ................ 347/213 |
| 2004/0238948 | A1 | * | 12/2004 | Shiozawa et al. ............. 257/723 |
| 2005/0146056 | A1 | * | 7/2005 | Shibata ........................ 257/787 |
| 2005/0184379 | A1 | * | 8/2005 | Shiozawa et al. ............. 257/686 |
| 2006/0097231 | A1 | * | 5/2006 | Mori ............................ 252/500 |
| 2006/0125096 | A1 | * | 6/2006 | Shiozawa et al. ............. 257/737 |
| 2006/0163749 | A1 | * | 7/2006 | Lee et al. ...................... 257/778 |
| 2007/0194464 | A1 | * | 8/2007 | Fukuzono .................... 257/791 |
| 2009/0098325 | A1 | * | 4/2009 | Uchida et al. .............. 428/36.91 |

FOREIGN PATENT DOCUMENTS

| | | |
|---|---|---|
| JP | 2002-016192 | 1/2002 |
| JP | 2002-373914 A | 12/2002 |
| JP | 2004-146534 | 5/2004 |
| JP | 2006-169395 A | 6/2006 |

* cited by examiner

ELECTRONIC COMPONENT MOUNTING STRUCTURE

TECHNICAL FIELD

The present invention relates to an electronic component mounting structure that is mounted on an electronic device such as a portable mobile.

BACKGROUND ART

As higher performance and more miniaturization of portable mobiles such as portable telephones and PDAs are forwarded, electronic components mounted thereon are demanded to be more densely mounted. As the results, in place of QFPs (Quad Flat Packages) of which substrate occupying area is large, flip-chip type packages such as BGA (Ball Grid Array) and CSP (Chip Size Package) are becoming a main stream in the packaging. In the BGA and CSP, different from the QFP where bonding terminals are laterally disposed, a plurality of solder balls (also called as solder bumps) is disposed on a bonding surface of a package, and the solder balls, after mounting on bonding terminals on the substrate side, are melted to establish electrical connection and physical bonding. Furthermore, when the stress due to the heat cycle or drop impact acts in concentration on a soldered bonding part, in some cases, the solder is broken to break the electrical continuation. Accordingly, a resin is filled in a gap between the BGA or CSP and the substrate after bonding to reinforce the solder bonding to improve the bonding reliability (patent literature 1). The portable mobile, due to inadvertence of a user, is assumed to be fallen on a floor or ground a plurality of times; accordingly, it is very important to improve the impact resistance to secure the bonding reliability.

As the resin for filling use, generally, an epoxy base thermosetting resin is used and, after the filling, is heated and cured to strongly bond the BGA or CSP and a substrate. However, since it is difficult to remove after curing once, it is not easy to newly repair the BGA or CSP when it is judged fault by the energizing test carried out after bonding with a substrate. In this connection, portions where the resin is filled are restricted to regions of four corners of the BGA or CSP to reduce a bonding area, and, thereby, labor and cost necessary for repairing are reduced (patent literatures 2 and 3).

[Patent literature 1] JP-A No. 2004-146534
[Patent literature 2] JP-A No. 2000-299356
[Patent literature 3] JP-A No. 2002-16192

DISCLOSURE OF THE INVENTION

An electronic component mounting structure in which a BGA or CSP is soldered to a substrate is desirable to be able to combine the heat cycle resistance, the impact resistance and the repairability at a high level. However, since these characteristics are in the trade-off relationship, when the impact resistance is considered most important and a resin is filled in an entire region of a gap between the BGA or CSP and the substrate to reinforce the bonding, a bonding area is increased to deteriorate the repairability. By contrast, when the repairability is considered most important and portions where the resin is filled are restricted to four corners of the BGA or CSP, a bonding area is reduced to be difficult to obtain sufficient reinforcement effect.

In this connection, the invention intends to provide an electronic component mounting structure that can combine the repairability and the impact resistance.

According to the invention, an electronic component mounting structure in which a plurality of solder balls disposed in plane between an electronic component and a substrate is melted to bond the electronic component and the substrate and a bond reinforcing resin is filled between the electronic component and the substrate and cured, wherein the bond reinforcing resin is a resin adhesive containing an epoxy resin and a flexible resin or a resin adhesive made of a flexible resin, filled in portions at least at four corners of the electronic component and has the tensile elongation in the range of 5 to 40% after curing.

Additionally, the flexible resin preferably contains at least any one of a cardanol epoxidation product, polypropylene glycol diglycidyl ether, diglycidyl ether of bisphenol A-alkylene oxide adduct, DGEBA/polymeric fatty acid adduct, polymeric fatty acid polyglycidyl ester and urethane prepolymer.

Further, the resin preferably further includes a rubber, the rubber including at least any one of natural rubber, styrene rubber, butadiene rubber, chloroprene rubber, butyl rubber, nitrile rubber, ethylene propylene rubber, silicone rubber and urethane rubber.

Furthermore, the resin after curing is preferred not to be in contact with any one of a plurality of solder balls disposed in plane between the electronic component and the substrate.

Moreover, the thixotropic ratio of the resin is preferred to be 2 or more.

According to the invention, an electronic component mounting structure that is excellent in the repairability such as the easy removability of the cured resin and the reusability of the substrate, allows the elongation of the resin per se to the impact at the time of drop to be able to play a role of bonding reinforcement without breaking and is excellent as well in the impact resistance can be realized.

BEST MODE FOR CARRYING OUT THE INVENTION

Figure 1A:
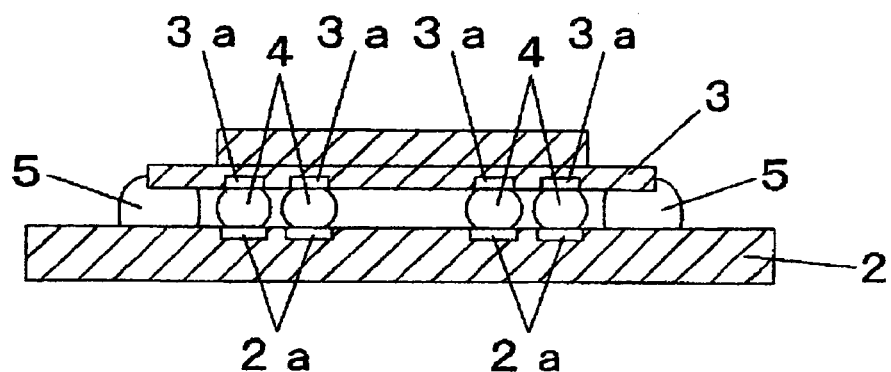
FIG. 1A is a side view of an electronic component mounting structure of an embodiment of the invention,
FIG. 1B being a plan view thereof.
Figure 1B:
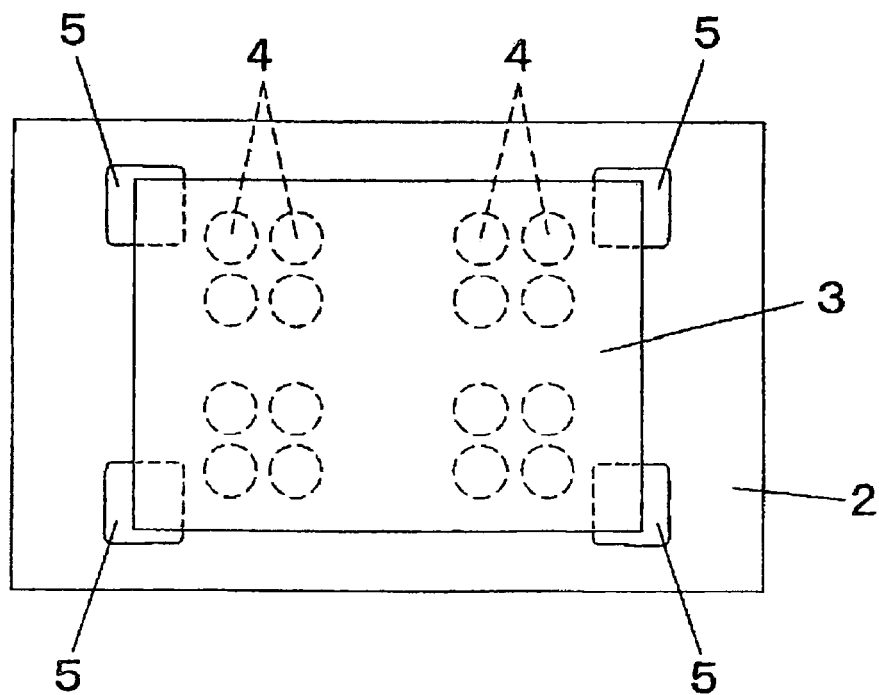
Figure 2:
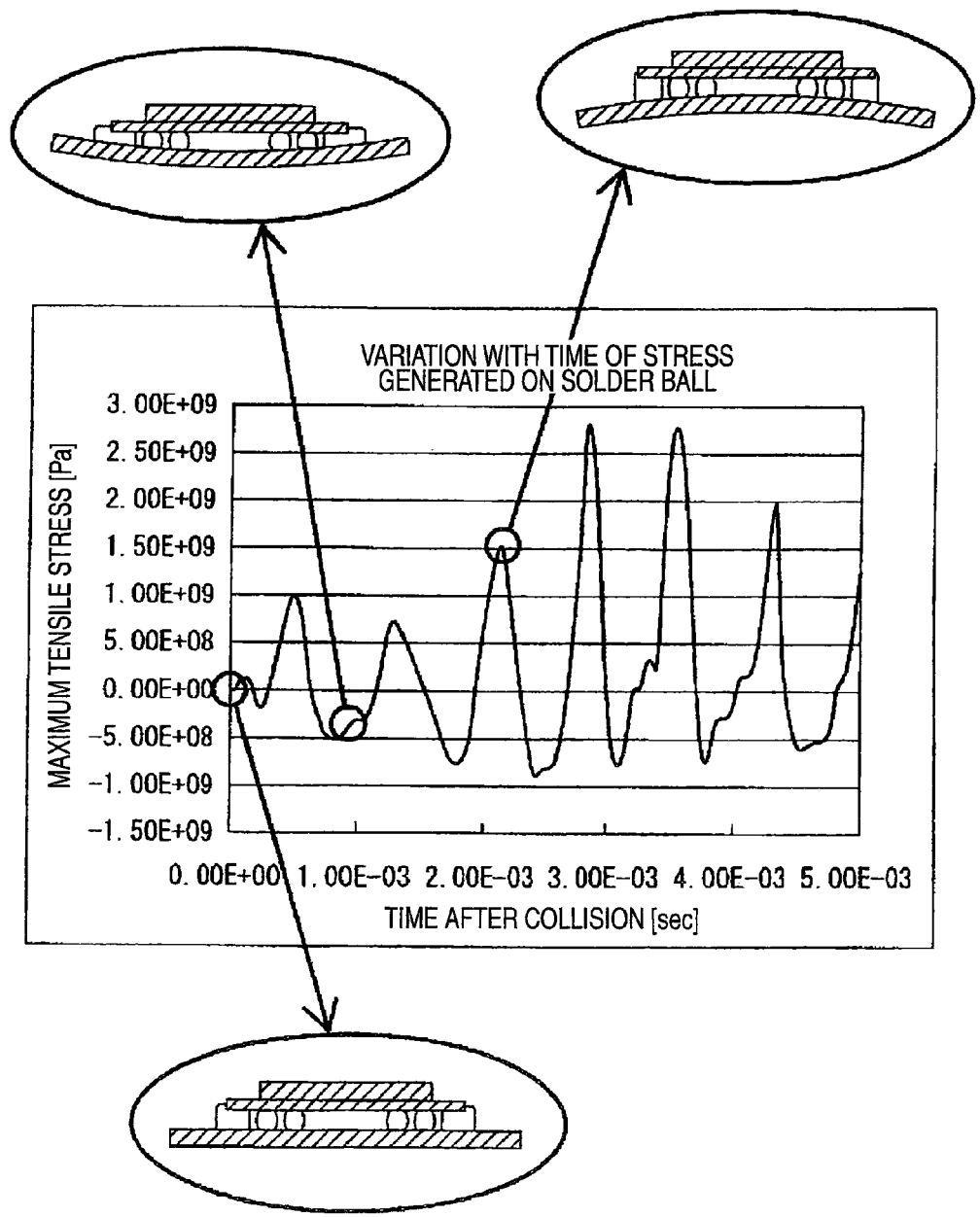
FIG. 2 is a diagram showing results obtained by analyzing, by use of the infinite element method, the stresses generated on solder balls when an electronic component mounting structure of the embodiment of the invention is dropped naturally in a level state.

An embodiment of the invention will be described with reference to the drawings. FIG. 1A is a side view of an electronic component mounting structure of an embodiment of the invention and FIG. 1B is a plan view thereof. FIG. 2 is a diagram showing results obtained by analyzing, according to the finite element method, stresses generated on solder balls when an electronic component mounting structure of the embodiment of the invention is naturally fallen in a horizontal state.

In the beginning, an electronic component mounting structure of the embodiment will be described with reference to FIGS. 1A and 1B. In the drawing, an electronic component mounting structure 1 has a structure where a plurality of solder balls 4 disposed in plane between a substrate 2 and an electronic component 3 is melted to bond the electronic component 3 and the substrate 2 and a bond reinforcing resin 5 is filled between the electronic component 3 and the substrate 2 and cured. The solder balls 4 are disposed in bump electrically continued in advance to a plurality of bonding terminals 3a on the electronic component 3 side, and the solder balls 4 are brought into contact with a plurality of bonding terminals 2a on the substrate 2 side and melted to solder the both terminals, thereby the electronic component 3 is mounted electrically and physically connected to the substrate 2. As the electronic component 3, other than the BGA (Ball Grid Array) or CSP (Chip Size Package) where an IC chip is packaged, a bare chip that is not packaged can be used.

The resin 5 is formed of a thermosetting epoxy resin as a main component and a flexible resin blended therein. As the flexible resin that is blended, a cardanol epoxidation product, polypropylene glycol diglycidyl ether, diglycidyl ether of bisphenol A-alkylene oxide adduct, DGEBA/polymeric fatty acid adduct, polymeric fatty acid polyglycidyl ester and urethane prepolymer can be cited. The blending ratios of the respective flexible resins are controlled so that the tensile elongation after curing the resin 5 in which at least any one thereof is blended may be in the range of 5 to 40%. A plastic resin may be used as it is as the resin 5 for reinforcement use.

The resin 5 is filled in a portion that is a gaps between the electronic component 3 and the substrate 2 after mounting and corresponds to four corners of the electronic component 3 so as not to come into contact with the solder balls 4. In order to inhibit the filled resin 5 from moving toward a center of the electronic component owing to the surface tension to come into contact with the solder balls 4, the thixotropic ratio is desired to be 2 or more. The thixotropic ratio is a numerical value obtained by dividing the viscosity measured at the number of rotations of 0.5 rpm by the viscosity measured at the number of rotations of 5.0 rpm by use of an E-type rotation viscometer (3° cone is used) at 25° C.

In the electronic component mounting structure 1, four corners of the electronic component 3 are reinforcement bonded with the substrate 3 and the cured resin 5 is not in contact with the solder balls 4; accordingly, when an electronic component 3 judged to be fault after the mounting is exchanged with a new electronic component, the resin 5 can be removed readily and, without breaking the bonding terminals 2a on the substrate 2 side, the resin 5 can be removed; as the result, the substrate can be reused. Thus, the electronic component mounting structure 1 is high in the easy removability of the cured resin and the reusability of the substrate, that is, excellent in the repairability.

In the next place, the impact resistance of the electronic component mounting structure of the embodiment will be described. In order to verify the impact resistance of the electronic component mounting structure 1, the drop test is carried out under the conditions below. With each of the substrate surfaces of the electronic component mounting structures 1 that are reinforcement bonded with a plurality of resins A through G different in the tensile elastic modulus and the tensile elongation after the curing held level, the electronic component mounting structure 1 is fastened to a plastic test tool and naturally dropped 30 times from a height of 150 cm, followed by investigating whether the solder ball 4 is broken or not to evaluate the impact resistance. A dropping height of 150 cm is determined based on a height when a user uses a portable mobile such as a portable telephone on which an electronic component mounting structure 1 is mounted, that is, a case where a portable mobile is inadvertently or due to an accident dropped is assumed.

Furthermore, according to the finite element method (FEM), the inventors analyzed a variation with time of the stress generated to the solder ball owing to the drop test. FIG. 2 shows results thereof. According to FIG. 2, when the naturally dropped electronic component mounting structure 1 collides with a floor or a ground, the solder balls 4 undergo alternately with time the tensile stress and compression stress. At a time substantially 1 ms after the collision, the substrate 2 flexes downward in convex and a gap with the electronic component 3 contracts; accordingly, the compression stress (the tensile stress on a minus side) is generated on the solder ball 4. At a time substantially 2 ms after the collision, the substrate 2 flexes upward in convex to expand a gap with the electronic component; accordingly, the tensile stress is generated on the solder balls 4. At substantially 3 ms after the collision, the maximum tensile stress is generated and gradually decreases thereafter. Furthermore, the maximum tensile stress generated to the solder ball is not generated at the first peak (peak of a waveform) immediately after the drop but is generated at a peak thereafter. This is considered because, owing to an external force applied upon collision, the substrate 2 and the electronic component 3 vibrate at different periods and, when peaks of the periods coincide, the gap with the electronic component 3 is largely expanded to maximize the tensile stress generated on the solder ball. Such the periodic tensile stress (elongation) is considered generated not only on the solder balls but also on the resin that reinforces the four corners.

The stress generated to the solder balls 4 is considered proportional to an extent of expansion and contraction of a gap between the substrate 2 and the electronic component 3; accordingly, when the expansion/contraction ratio of the gap between the substrate 2 and the electronic component 3 is small, the generated stress can be suppressed smaller. When this idea is adopted, the resin that reinforces the four corners of the electronic component is excellent in the reinforcement effect when the tensile elastic modulus is higher. However, in the drop test, even with a resin high in the tensile elastic modulus, a sufficient reinforcement effect cannot be confirmed. In this connection, the inventors considered a hypothesis below.

When a resin 5 of which tensile elastic modulus after curing is relatively high is used to reinforce, while, generally, the expansion and contraction rate of a gap between the substrate 2 and the electronic component 3 can be suppressed low, by contrast, the tensile elongation becomes smaller. As the result, the elongation rate of a gap with the electronic component due to the flexion of the substrate 2 generated by the collision exceeds the tensile elongation of the cured resin 5 to generate cracks in the resin 5 to finally result in the breaking. The broken resin 5 cannot fulfill an initial object, that is, a role of reinforcing the bonding; accordingly, at a peak of the vibration thereafter, excessive stress exceeding the tolerance stress is generated on the solder ball 4 to break the solder.

Based on the hypothesis, with electronic component mounting structures in which the tensile elongations of the resins are differentiated, the drop tests are carried out. In Table 1 below, evaluations of the impact resistances when the resins A through G are used to carry out the drop test are shown.

TABLE 1

| | Tensile elastic modulus | Tensile elongation rate | Evaluation of impact resistance |
|---|---|---|---|
| Resin A | 14 Gpa | 0.8% | Unacceptable |
| Resin B | 12 Gpa | 1% | Unacceptable |
| Resin C | 6 Gpa | 1.6% | Unacceptable |
| Resin D | 4 Gpa | 2.5% | Unacceptable |

TABLE 1-continued

|  | Tensile elastic modulus | Tensile elongation rate | Evaluation of impact resistance |
|---|---|---|---|
| Resin E | 3 Gpa | 5% | Acceptable |
| Resin F | 2 Gpa | 9% | Acceptable |
| Resin G | 1 Gpa | 37% | Acceptable |

The tensile elongation is defined by an elongation (equation 1) corresponding to the tensile strength in the test according to JIS K6911. In the JIS K7113, it is stipulated as "tensile breaking elongation".

$$l = \frac{L - L_0}{L0} \times 100 \qquad \text{[Equation 1]}$$

l: tensile breaking elongation (%)
L: separation between marked lines at the breaking (mm)
$L_0$: separation between initial marked lines (mm)

When the tensile elongation is in the range of 0.8 to 2.5%, at the first drop, the solder ball was confirmed to be broken (unacceptable in the impact resistance evaluation). On the other hand, when the tensile elongation is in the range of 5 to 37%, even after the thirtieth drop, the solder balls all were not confirmed broken (acceptable in the impact evaluation). Therefrom it is found that while, when the resins A through D that are relatively small in the tensile elongation after the curing are used, the resin that is used to reinforce the bonding is broken at the first impact, as the result, excessive stress is generated on the solder ball itself to result in breaking the solder ball; on the other hand, when the resins E through G that are relatively large in the tensile elongation are used, a gap between the substrate 2 and the electronic component 3 is tolerated to expand to some extent, although the stress that is generated on the solder ball itself becomes large, the resin becomes difficult to break to be able to fulfill a role of reinforcing the bonding of the body, and thereby the solder ball is inhibited from breaking. Accordingly, when the resin E, F or G is filled in portions corresponding to four corners of the electronic component, an electronic component structure excellent in the impact resistance and the repairability can be realized.

The resins A through G are prepared by changing the kinds and blending ratios of the flexible resins that are blended with the epoxy resin. When the flexible resin is used as it is as a reinforcing resin, the theoretical tensile elongation after the curing is substantially 40%. In the experiment, as the resin where the flexible resin is used as it is, the resin G is evaluated (actual tensile elongation is 37%). Even in this case, the impact resistance evaluation was verified to be acceptable.

Furthermore, at least any one rubber of natural rubber, styrene rubber, butadiene rubber, chloroprene rubber, butyl rubber, nitrile rubber, ethylene propylene rubber, silicone rubber and urethane rubber may be added to a reinforcing resin to improve the impact resistance of the resin.

INDUSTRIAL APPLICABILITY

According to the invention, an electronic component mounting structure that is excellent in the repairability such as the easy removability of the cured resin and the reusability of the substrate, allows the resin per se expanding to the impact at the time of drop to be able to play a role of bonding reinforcement without breaking and is excellent as well in the impact resistance can be realized. The electronic component mounting structure is useful as an electronic device mounted on electronic equipment such as a portable mobile.

The invention claimed is:

1. An electronic component mounting structure comprising:
a plurality of solder balls disposed in plane between an electronic component and a substrate, and melted to bond the electronic component and the substrate; and
a bonding reinforcement resin filled between the electronic component and the substrate, and cured,
wherein the resin is a resin adhesive containing an epoxy resin and a flexible resin or a resin adhesive made of a flexible resin, filled in portions corresponding to at least at four corners of the electronic component and has the tensile elongation in the range of 5 to 40% after curing.

2. The electronic component mounting structure of claim 1, wherein the flexible resin contains at least any one of a cardanol epoxidation product, polypropylene glycol diglycidyl ether, diglycidyl ether of bisphenol A-alkylene oxide adduct, DGEBA/polymeric fatty acid adduct, polymeric fatty acid polyglycidyl ester and urethane prepolymer.

3. The electronic component mounting structure of claim 1, wherein the resin further includes a rubber, the rubber containing at least any one of natural rubber, styrene rubber, butadiene rubber, chloroprene rubber, butyl rubber, nitrile rubber, ethylene propylene rubber, silicone rubber and urethane rubber.

4. The electronic component mounting structure of claim 1, wherein the resin after curing is not in contact with any one of a plurality of solder balls disposed in plane between the electronic component and the substrate.

5. The electronic component mounting structure of claim 1, wherein the thixotropic ratio of the resin is 2 or more.

* * * * *